United States Patent
Kitamura

(10) Patent No.: US 7,138,311 B2
(45) Date of Patent: Nov. 21, 2006

(54) SEMICONDUCTOR INTEGRATED CIRCUIT DEVICE AND MANUFACTURE METHOD THEREFORE

(75) Inventor: Akio Kitamura, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/869,811

(22) Filed: Jun. 16, 2004

(65) Prior Publication Data

US 2004/0232498 A1 Nov. 25, 2004

Related U.S. Application Data

(62) Division of application No. 10/055,722, filed on Jan. 23, 2002, now Pat. No. 6,833,594.

(30) Foreign Application Priority Data

Jan. 23, 2001 (JP) .............................. 2001-015042

(51) Int. Cl.
*H01L 29/72* (2006.01)
(52) U.S. Cl. ...................... 438/228; 257/368
(58) Field of Classification Search ................ 438/199, 438/229, 232, 275, 289, 228
See application file for complete search history.

(56) References Cited

U.S. PATENT DOCUMENTS

| | | | |
|---|---|---|---|
| 4,403,395 A | 9/1983 | Curran | 29/571 |
| 5,342,802 A | 8/1994 | Kubokoya et al. | |
| 5,409,848 A * | 4/1995 | Han et al. | 438/302 |
| 5,516,711 A * | 5/1996 | Wang | 438/217 |
| 5,541,125 A | 7/1996 | Williams et al. | 437/34 |
| 5,830,789 A * | 11/1998 | Lien et al. | 438/217 |
| 5,877,531 A | 3/1999 | Fukatsu et al. | |
| 5,899,732 A | 5/1999 | Gardner et al. | 438/473 |
| 5,963,799 A * | 10/1999 | Wu | 438/199 |
| 6,020,227 A | 2/2000 | Bulucea | |
| 6,096,591 A | 8/2000 | Gardner et al. | |
| 6,157,062 A | 12/2000 | Vasanth et al. | |

(Continued)

FOREIGN PATENT DOCUMENTS

EP 0 827 205 A2 3/1998

(Continued)

OTHER PUBLICATIONS

Dolny G. et al., "Complementary DMOS/BICMOS Technology for Power IC Applications," Dec. 11, 1988, IEEE, pp. 796-799.

*Primary Examiner*—Edward Wojciechowicz
(74) *Attorney, Agent, or Firm*—Rossi, Kimms & McDowell, LLP

(57) ABSTRACT

A submicron CMOS transistor is mounted on the same substrate together with an analog CMOS transistor, a high voltage-resistance MOS transistor, a bipolar transistor, a diode, or a diffusion resistor, without degrading the characteristics of these components. When a punch-through stopper area is formed on a main surface side of a semiconductor substrate, an area in which an analog CMOS transistor, a high voltage-resistance MOS transistor, a bipolar transistor, a diode, or a diffusion resistor is formed is masked, and for example, an ion injection is then carried out. Thus, a punch-through stopper area is formed in the area in which a submicron CMOS transistor is formed, while preventing the formation of a punch-through stopper area in the area in which an analog CMOS transistor, a high voltage-resistance MOS transistor, a bipolar transistor, a diode, or a diffusion resistor is formed.

4 Claims, 14 Drawing Sheets

U.S. PATENT DOCUMENTS

| | | | |
|---|---|---|---|
| 6,238,982 B1 | 5/2001 | Krivokapic et al. | 438/275 |
| 6,294,416 B1 * | 9/2001 | Wu | 438/199 |
| 6,309,921 B1 * | 10/2001 | Ema et al. | 438/228 |
| 6,329,693 B1 | 12/2001 | Kumagai | 257/371 |
| 6,355,531 B1 | 3/2002 | Mandelman et al. | 438/276 |
| 6,462,385 B1 | 10/2002 | Kumagai | 257/372 |
| 6,476,430 B1 | 11/2002 | Schmitz et al. | 257/274 |
| 2002/0197812 A1 | 12/2002 | Fan | |

FOREIGN PATENT DOCUMENTS

| | | |
|---|---|---|
| JP | 60-10780 A | 1/1985 |
| JP | 60-105277 A | 6/1985 |
| JP | 61-190983 A | 8/1986 |

* cited by examiner

US 7,138,311 B2

SEMICONDUCTOR INTEGRATED CIRCUIT DEVICE AND MANUFACTURE METHOD THEREFORE

This application is a Divisional of Ser. No. 10/055,722 filed Jan. 23, 2002, now U.S. Pat. No. 6,833,594.

FIELD OF THE INVENTION

The present invention relates to a semiconductor circuit device and a manufacture method therefor, and in particular, to a semiconductor integrated circuit device preferably applied to a power IC having a digital circuit, an analog circuit, and a high voltage-resistance circuit mixed thereon.

BACKGROUND

In the prior art, small-scale logic circuits are mounted in power ICs and thus require no microfabrication process as in the case with memory or logic LSIs. However, in the field of power management for power ICs and the like, a self-correction process based on a CPU has recently been required to perform more sophisticated voltage monitoring and charging functions. This requires the mounting of large-scale logic circuits on power ICs.

In general, memory or logic LSIs comprise submicron MOS transistors having a channel length of 1 µm or shorter in order to further integration. Such a short-channel-type MOS transistor has a punch-through stopper layer formed therein in order to restrain punch-through between a source area and a drain area. A semiconductor integrated circuit device comprising a punch-through stopper layer is described in Japanese Patent Application Publication No. 61-190983.

Furthermore, Japanese Patent Application Publication No. 60-10780 describes a method for forming a punch-through stopper layer using an ion injection method, while Japanese Patent Application Publication No. 60-105277 describes a method for manufacturing a MOS transistor employing an LDD structure with a P pocket in order to reduce the concentration of electric fields in the vicinity of the drain area.

However, when a submicron MOS transistor comprising a punch-through stopper layer as described above is integrated on the same substrate with an analog CMOS transistor, a high voltage-resistance MOS transistor, a bipolar transistor, a diode, and a diffusion resistor, if the analog CMOS transistor, high voltage-resistance MOS transistor, bipolar transistor, diode, and diffusion resistor also have a punch-through stopper layer formed therein, the accuracy of the threshold voltage of the analog CMOS transistor may decrease due to variations in the surface concentration of a diffusion layer of the punch-through stopper layer, or the high voltage-resistance MOS transistor may have a reduced voltage resistance.

It would therefore be desirable to provide a semiconductor integrated circuit device having a submicron CMOS transistor integrated on the same substrate with an analog CMOS transistor, a high voltage-resistance MOS transistor, a bipolar transistor, a diode, or a diffusion resistor, without degrading the characteristics of these components.

It would further be desirable to provide a method for manufacturing a semiconductor integrated circuit device allowing a submicron CMOS transistor to be mounted on the same substrate together with an analog CMOS transistor, a high voltage-resistance MOS transistor, a bipolar transistor, a diode, or a diffusion resistor without degrading the characteristics of these components.

SUMMARY OF THE INVENTION

The present invention provides a semiconductor integrated circuit device, in which, when a punch-through stopper layer is formed on a main surface side of a semiconductor substrate, for example, ions are injected into an exposed area in which a submicron CMOS transistor is to be formed, while masking an area in which an analog CMOS transistor, a high voltage-resistance MOS transistor, a bipolar transistor, a diode, or a diffusion resistor is to be formed, thereby preventing the formation of a punch-through stopper area in the area in which the analog CMOS transistor, high voltage-resistance MOS transistor, bipolar transistor, diode, or diffusion resistor is to be formed. Accordingly, a submicron CMOS transistor comprising a punch-through stopper area and an analog CMOS transistor, a high voltage-resistance MOS transistor, a bipolar transistor, a diode, or a diffusion resistor having no punch-through stopper area are formed on the same semiconductor substrate.

BRIEF DESCRIPTION OF THE DRAWINGS

The invention will now be described in greater detail with reference to certain preferred embodiments thereof along with the accompanying drawings, wherein.

DETAILED DESCRIPTION OF THE PREFERRED EMBODIMENTS

Figure 1:
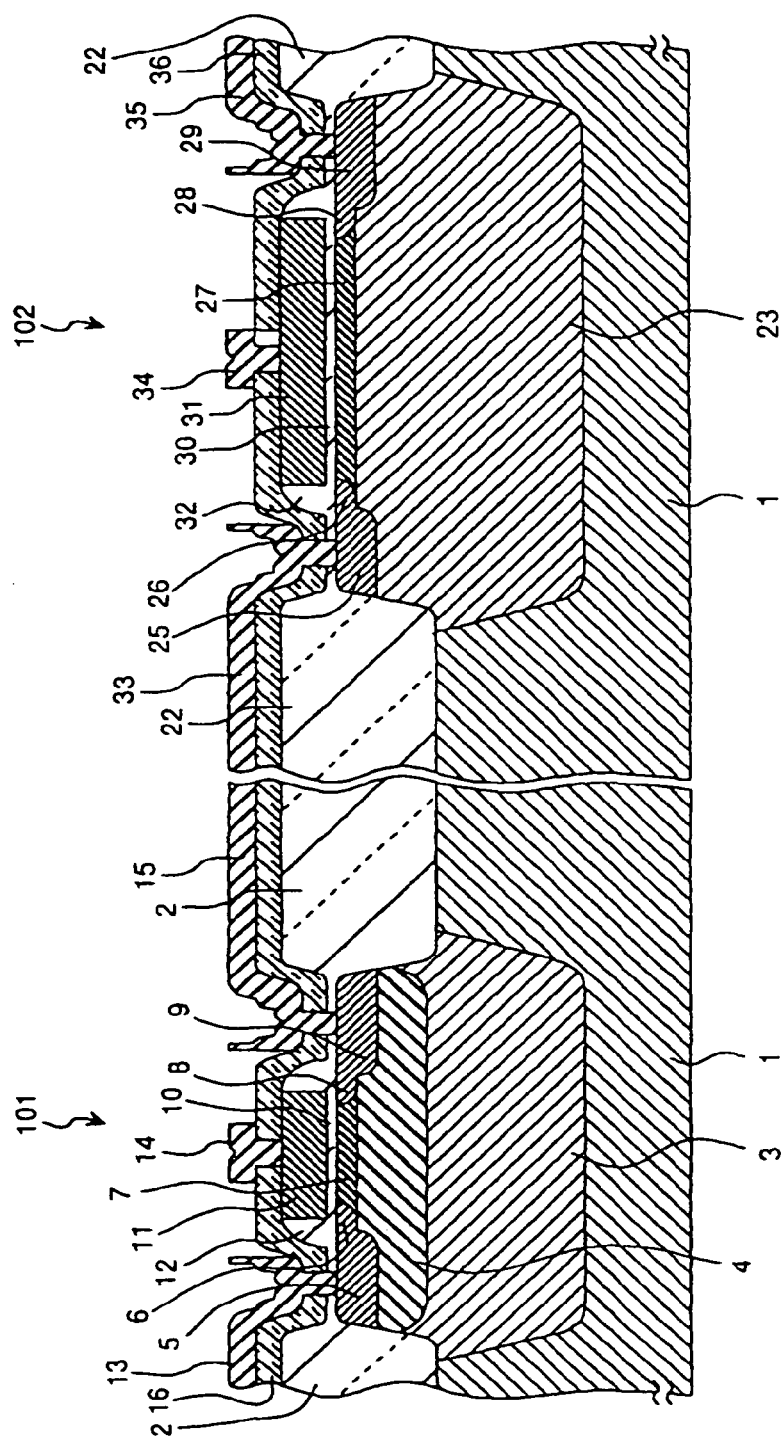
FIG. 1 is a vertical sectional view showing an essential part of a semiconductor integrated circuit device according to a first embodiment of the present invention.

FIG. 1 is a vertical sectional view showing an essential part of a semiconductor integrated circuit device according to a first embodiment of the present invention. This semiconductor integrated circuit device comprises a digital CMOS transistor constituting a digital circuit and an analog CMOS transistor constituting an analog circuit, both transistors being formed on the same semiconductor substrate 1. However, FIG. 1 shows a digital NMOS transistor 101 (shown in the left of the figure) and an analog NMOS transistor 102 (shown in the right of the figure), with a PMOS transistor omitted therefrom.

The digital NMOS transistor 101 comprises a field oxide film 2 formed on a main surface side of a P-type semiconductor substrate 1 and a P well area 3 formed in an element-forming area surrounded by the field oxide film 2 and on the main surface side of the semiconductor substrate 1. A P$^-$ punch-through stopper area 4 of $5\times10^{16}$ to $2\times10^{17}$/cm$^3$ surface concentration is formed in the P well area 3 and on the main surface side of the semiconductor substrate 1. The P punch-through stopper area 4 has a higher impurity concentration than the P well area 3. An N$^+$ source area 5, a source-side N-LDD area 6, a P-channel formed area 7, a drain-side N-LDD area 8, and an N$^+$ drain area 9 are formed in the P-punch-through stopper area 4 and on the main surface side of the semiconductor substrate 1.

Furthermore, gate polysilicon 111 is formed on the P-channel formed area 7 via a gate insulated film 10. A spacer oxide film 12 is formed at the sides of the gate polysilicon 11. A source electrode 13, a gate electrode 14, and a drain electrode 15 are electrically connected to the N$^+$ source area 5, the gate polysilicon 11, and the N+ drain area 9, respectively, via contact holes opened in an interlayer insulated film 16. Furthermore, wires, a passivation film, and the like (not shown) are laminated thereon.

A digital PMOS transistor constituting a digital CMOS transistor together with the digital NMOS transistor 101, constructed as described above, is produced in an N well area (not shown) formed on the main surface side of the semiconductor substrate 1 and is constructed in the same manner as the digital NMOS transistor 101. However, in the above description of the digital NMOS transistor 101, P must be changed to N, while N must be changed to P, except for the description of the semiconductor substrate 1.

A digital CMOS transistor constructed as described above has, for example, a minimum channel length of about 0.6 μm. Furthermore, it has a threshold voltage of about 0.8 V. This digital CMOS transistor is used for a logic circuit.

An analog NMOS transistor 102 comprises a field oxide film 22 formed on the main surface side of the P-type semiconductor substrate 1 and a P well area 23 formed in an element formed area surrounded by the field oxide film 22 and on the main surface side of the semiconductor substrate 1. An N+ source area 25, a source-side N-LDD area 26, a P-channel formed area 27, a drain-side N-LDD area 28, and an N+ drain area 29 are formed in the P well area 23 and on the main surface side of the semiconductor substrate 1.

Furthermore, gate polysilicon 31 is formed on the P$^-$channel formed area 27 via a gate insulated film 30. A spacer oxide film 32 is formed at the sides of the gate polysilicon 31. A source electrode 33, a gate electrode 34, and a drain electrode 35 are electrically connected to the N$^+$ source area 25, the gate polysilicon 31, and the N+ drain area 29, respectively, via contact holes opened in an interlayer insulated film 36. Furthermore, wires, a passivation film, and the like (not shown) are laminated thereon.

An analog PMOS transistor constituting an analog CMOS transistor together with the analog NMOS transistor 102, constructed as described above, is produced in the N well area (not shown) formed on the main surface side of the semiconductor substrate 1 and is constructed in the same manner as the analog NMOS transistor 101. However, in the above description of the analog NMOS transistor 102, P must be changed to N, while N must be changed to P, except for the description of the semiconductor substrate 1.

An analog CMOS transistor constructed as described above has, for example, a minimum channel length of about 1.0 μm. Furthermore, it has a threshold voltage of about 0.6 V, which is lower than that of the digital CMOS transistor. This analog CMOS transistor is used for a reference voltage circuit, a bias circuit, or any operational amplifier circuit that requires an accurate threshold voltage. Thus, variation is in the processing of the gate polysilicon 31 must be minimized, so that this transistor has a gate length of about 4 μm or longer. Accordingly, the analog CMOS transistor requires no microfabrication process.

Figure 2:
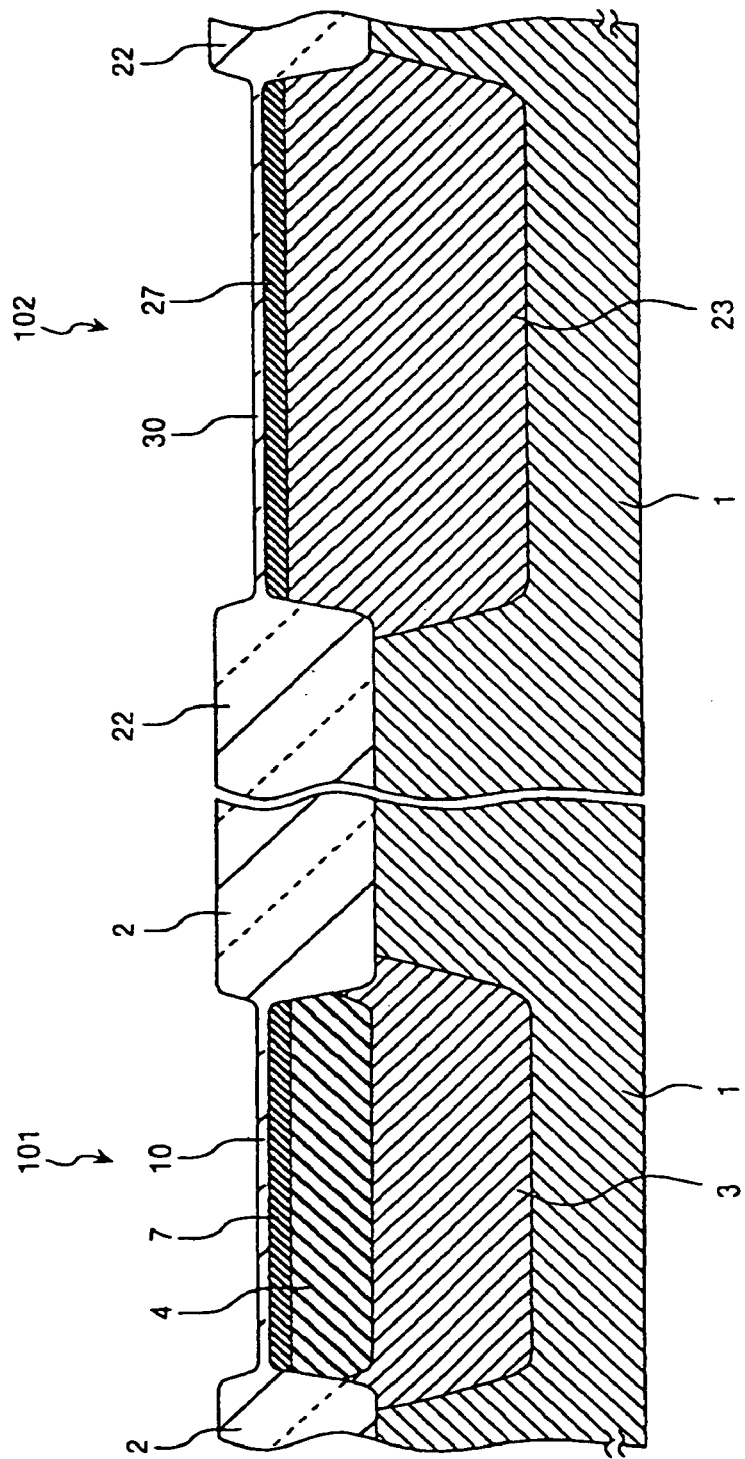
FIG. 2 is a vertical sectional view showing an essential part of the semiconductor integrated circuit device according to the first embodiment at a manufacturing stage.
Figure 3:
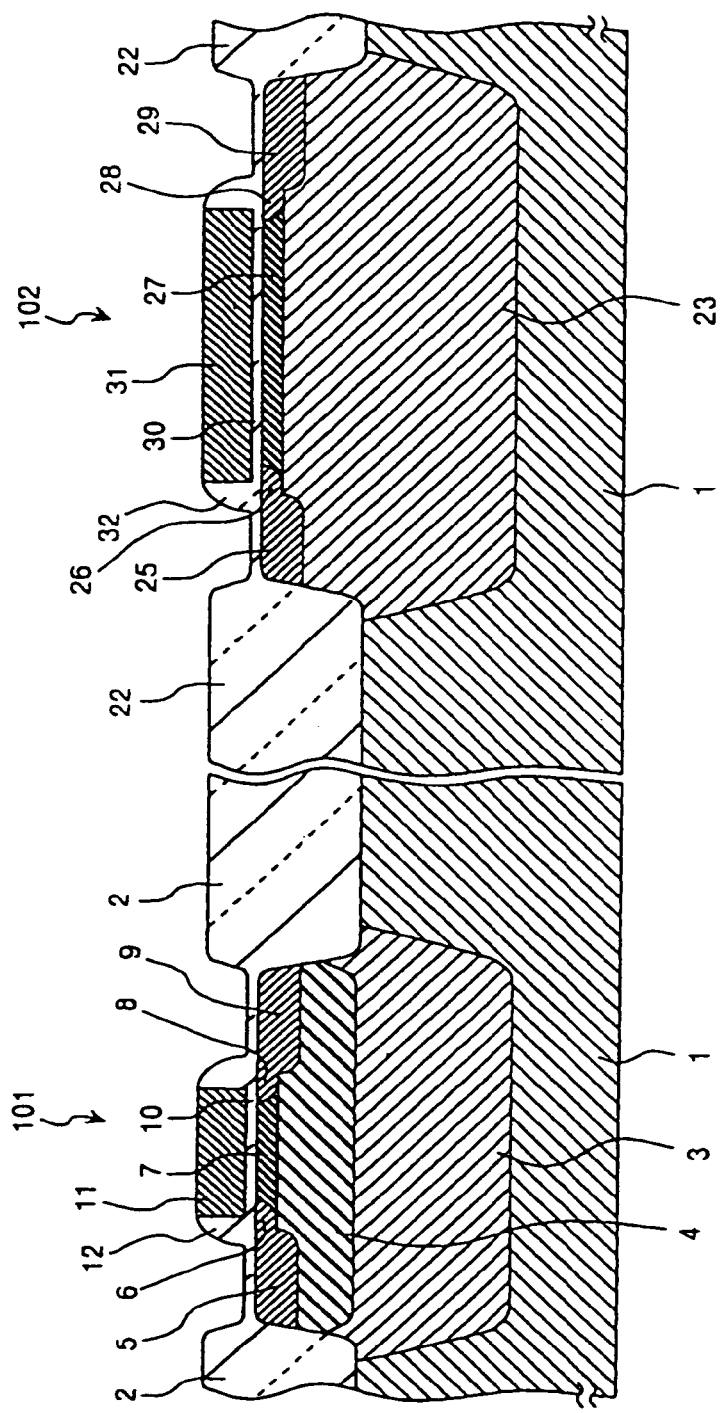
FIG. 3 is a vertical sectional view showing an essential part of the semiconductor integrated circuit device according to the first embodiment at a manufacturing stage.

A process for manufacturing a semiconductor integrated circuit device according to The first embodiment will now be described. FIGS. 2 and 3 are vertical sectional views showing an essential part of a semiconductor integrated circuit device according to The first embodiment at a manufacturing stage. First, as shown in FIG. 2, the P well areas 3 and 23, the field oxide films 2 and 22, and the gate insulated films 10 and 30 are formed on the main surface side of the semiconductor substrate 1 by a well-known method.

Subsequently, the area in which the analog NMOS transistor 102 is formed is coated, and the P$^-$ punch-through stopper area 4 is formed only in the area in which the digital NMOS transistor 101 is formed, using an ion injection method and a mask (not shown) having a pattern of a window corresponding to the area in which the digital NMOS transistor 101 is formed. Furthermore, the P$^-$ channel formed areas 7 and 27 are formed using the ion injection method. This configuration is shown in FIG. 2.

Subsequently, as shown in FIG. 3, the gate polysilicon 11 and 31 is formed, and the N-LDD areas 6, 8, 26, and 28 are formed using the ion injection method and a self-alignment process using the gate polysilicon 11 and 31 as a mask. Then, the spacer oxide films 12 and 32 are formed at the sides of the gate polysilicon 11 and 31, and the N$^+$ source areas 5 and 25 and the N+ drain areas 9 and 29 are formed using the ion injection method and a self-alignment process using the spacer oxide films 12 and 32 as masks. Impurity-diffusing areas including the punch-through stopper area 4 are activated through a thermal process. This configuration is shown in FIG. 3.

Subsequently, the interlayer insulated film 16 (same as the interlayer insulated film 36) is laminated, and contact holes are opened therein. Then, the source electrodes 13 and 33, the gate electrodes 14 and 34, and the drain electrodes 15 and 35 are formed by patterning, as shown in FIG. 1. Furthermore, wires, a passivation film, and the like are formed thereon to complete a semiconductor integrated circuit device. A PMOS transistor is manufactured in the same manner.

According to the first embodiment, described above, the digital NMOS transistor 101, which comprises the punch-through stopper area 4, and the analog NMOS transistor 102, which has no punch-through stopper area, are formed on the same semiconductor substrate 1, thereby omitting one diffusion layer that causes a variation in the analog NMOS transistor 102. This prevents any reduction of accuracy of the threshold voltage of the analog NMOS transistor 102. Furthermore, the threshold voltage of the analog NMOS transistor 102 can be set at a low value. This also applies to digital and analog PMOS transistors.

Figure 4:
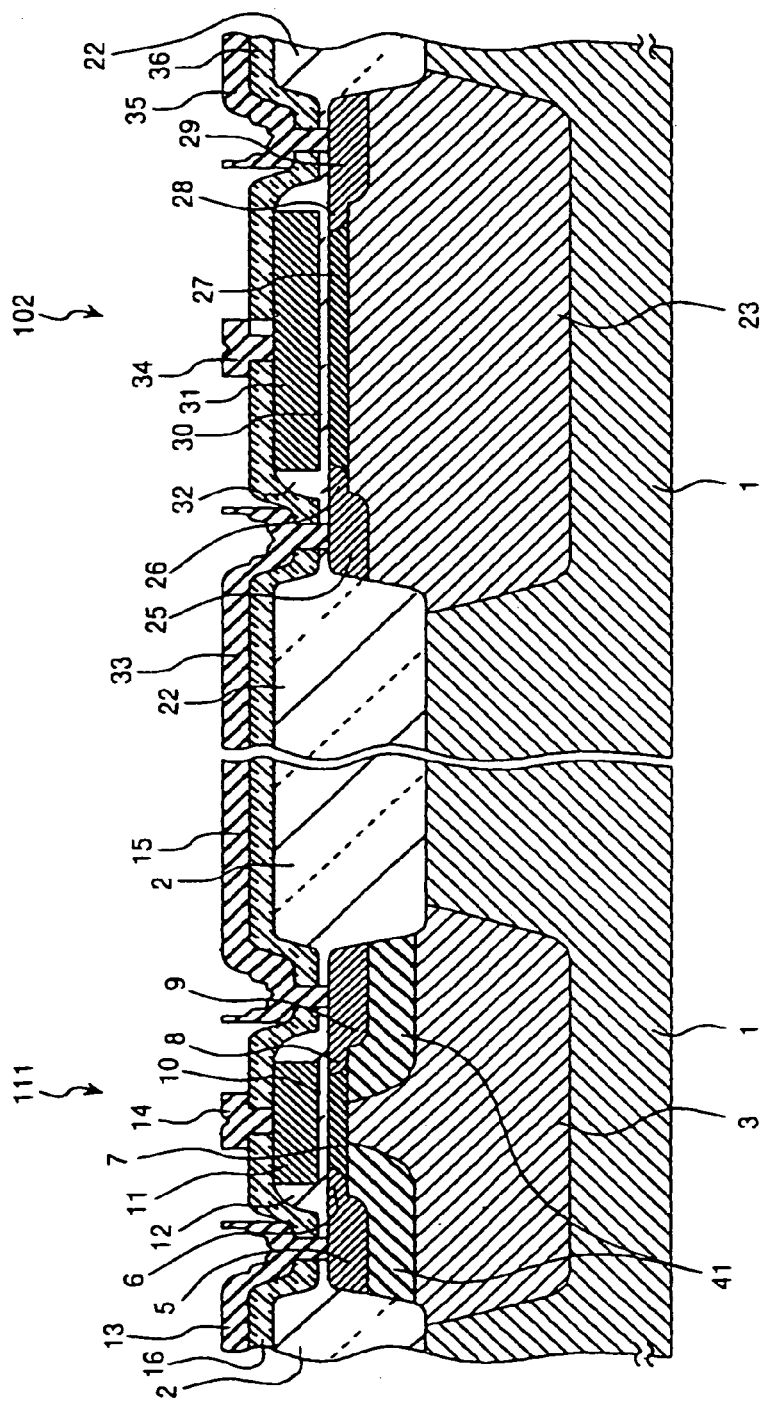
FIG. 4 is a vertical sectional view showing an essential part of a semiconductor integrated circuit device according to a second embodiment.

FIG. 4 is a vertical sectional view showing an essential part of a semiconductor integrated circuit device according to a second embodiment of the present invention. This semiconductor integrated circuit device comprises a digital NMOS transistor 111 (shown in the left of FIG. 4) and a digital PMOS transistor (not shown), both of which constitute a digital CMOS transistor, an analog NMOS transistor 102 (shown in the right of this figure) and an analog PMOS transistor (not shown) both of which constitute an analog CMOS circuit, all transistors being formed on the same semiconductor substrate 1. The same arrangements as those of the first embodiment are denoted by the same reference numerals, and a description thereof is omitted.

The digital NMOS transistor 111 has the field oxide film 2, the P well area 3, the P$^-$ punch-through stopper area 41, the N$^+$ source area 5, the source-side N-LDD area 6, the P$^-$ channel formed area 7, the drain-side N-LDD area 8, the N$^+$ drain area 9, the gate insulated film 10, the gate polysilicon 11, the spacer oxide film 12, the interlayer insulated film 16, the source electrode 13, the gate electrode 14, and the drain electrode 15 all formed on the main surface side of the P-type semiconductor substrate 1.

The P$^-$ punch-through stopper area 41 has a surface concentration of about $5 \times 10^{16}$ to $2 \times 10^{17}/cm^3$ and has a pocket structure enclosing the N-LDD areas 6 and 8. Furthermore, a digital PMOS transistor is produced in the N well area (not shown) formed on the main surface side of the P-type semiconductor substrate 1. The digital PMOS transistor is constructed in the same manner as described for the digital NMOS transistor 111, except that P is changed to N.

A digital CMOS transistor constructed as described above has, for example, a minimum channel length of about 0.6 µm. Furthermore, it has a threshold voltage of about 0.8 V. This digital CMOS transistor is used for a logic circuit.

As in the case with the first embodiment, an analog PMOS transistor is produced in the N well area (not shown) formed on the main surface side of the semiconductor substrate 1. The analog PMOS transistor is constructed in the same manner as described for the analog NMOS transistor 102, except that P is changed to N.

Figure 5:
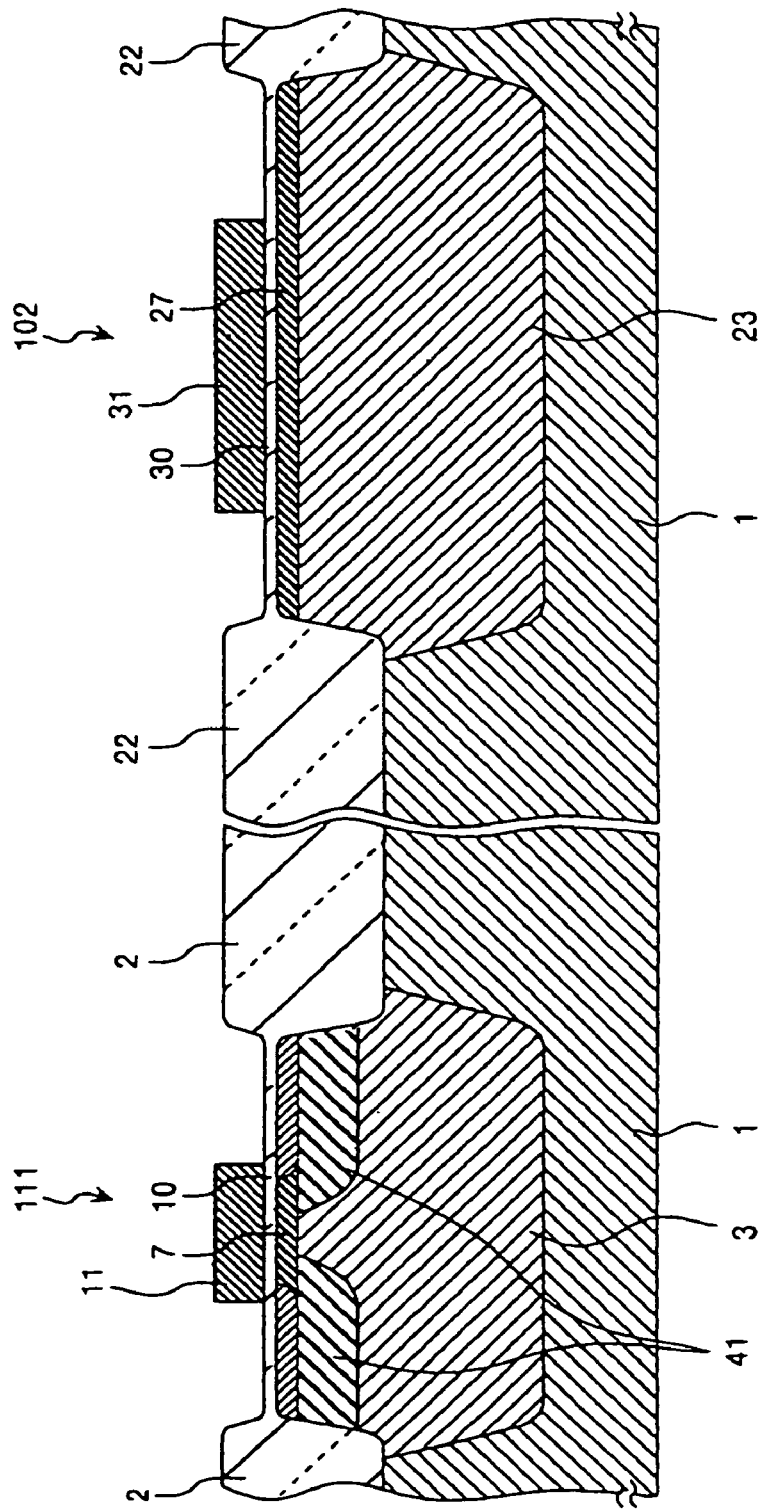
FIG. 5 is a vertical sectional view showing an essential part of the semiconductor integrated circuit device according to the second embodiment at a manufacturing stage.
Figure 6:
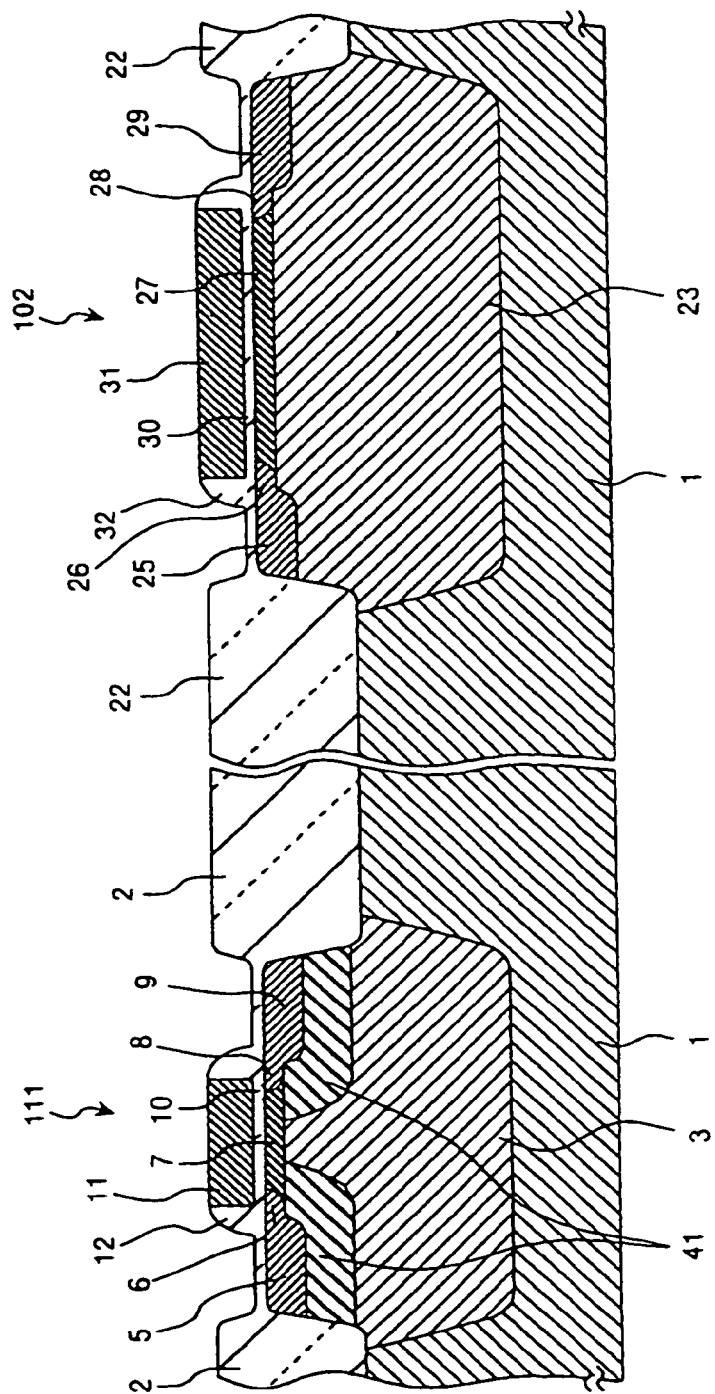
FIG. 6 is a vertical sectional view showing an essential part of the semiconductor integrated circuit device according to the second embodiment at a manufacturing stage.

A process for manufacturing a semiconductor integrated circuit device according to the second embodiment will now be described. FIGS. 5 and 6 are vertical sectional views showing an essential part of a semiconductor integrated circuit device according to the second embodiment at a manufacturing stage. First, as shown in FIG. 5, the P well areas 3 and 23, the field oxide films 2 and 22, and the gate insulated films 10 and 30 are formed on the main surface side of the semiconductor substrate 1 by a well-known method.

Subsequently, the P$^-$ channel formed areas 7 and 27 are formed by the ion injection method, and the gate polysilicon 11 and 31 is then formed. Then, the P$^-$ punch-through stopper area 41 of the pocket structure is formed only in the area in which the digital NMOS transistor 111 is formed, using the ion injection method and a self-alignment process using the gate polysilicon 11 as a mask. In this case, the area in which the analog NMOS transistor 102 is formed is masked so as to prevent impurities from being injected thereinto. This configuration is shown in FIG. 5.

Subsequently, as shown in FIG. 6, the N-LDD areas 6, 8, 26, and 28 are formed using the ion injection method and a self-alignment process using the gate polysilicon 11 and 31 as a mask. Then, the spacer oxide films 12 and 32, the N$^+$ source areas 5 and 25, and the N+ drain areas 9 and 29 are formed in the same manner as in The first embodiment. Impurity-diffusing areas including the P$^-$ punch-through stopper area 41 are activated through a thermal process. This configuration is shown in FIG. 6.

Subsequently, the interlayer insulated films 16 and 36, the source electrodes 13 and 33, the gate electrodes 14 and 34, and the drain electrodes 15 and 35 are formed in the same manner as in The first embodiment. Furthermore, wires, a passivation film, and the like are formed thereon to complete a semiconductor integrated circuit. A PMOS transistor is manufactured in the same manner.

According to the second embodiment, described above, the digital NMOS transistor 111, which comprises the punch-through stopper area 41, and the analog NMOS transistor 102, which has no punch-through stopper area, are formed on the same semiconductor substrate 1, thereby omitting one diffusion layer that causes variations in the analog NMOS transistor 102. This prevents any reduction of accuracy of the threshold voltage of the analog NMOS transistor 102. Furthermore, the threshold voltage of the analog NMOS transistor 102 can be set at a low value. This also applies to digital and analog PMOS transistors.

Figure 7:
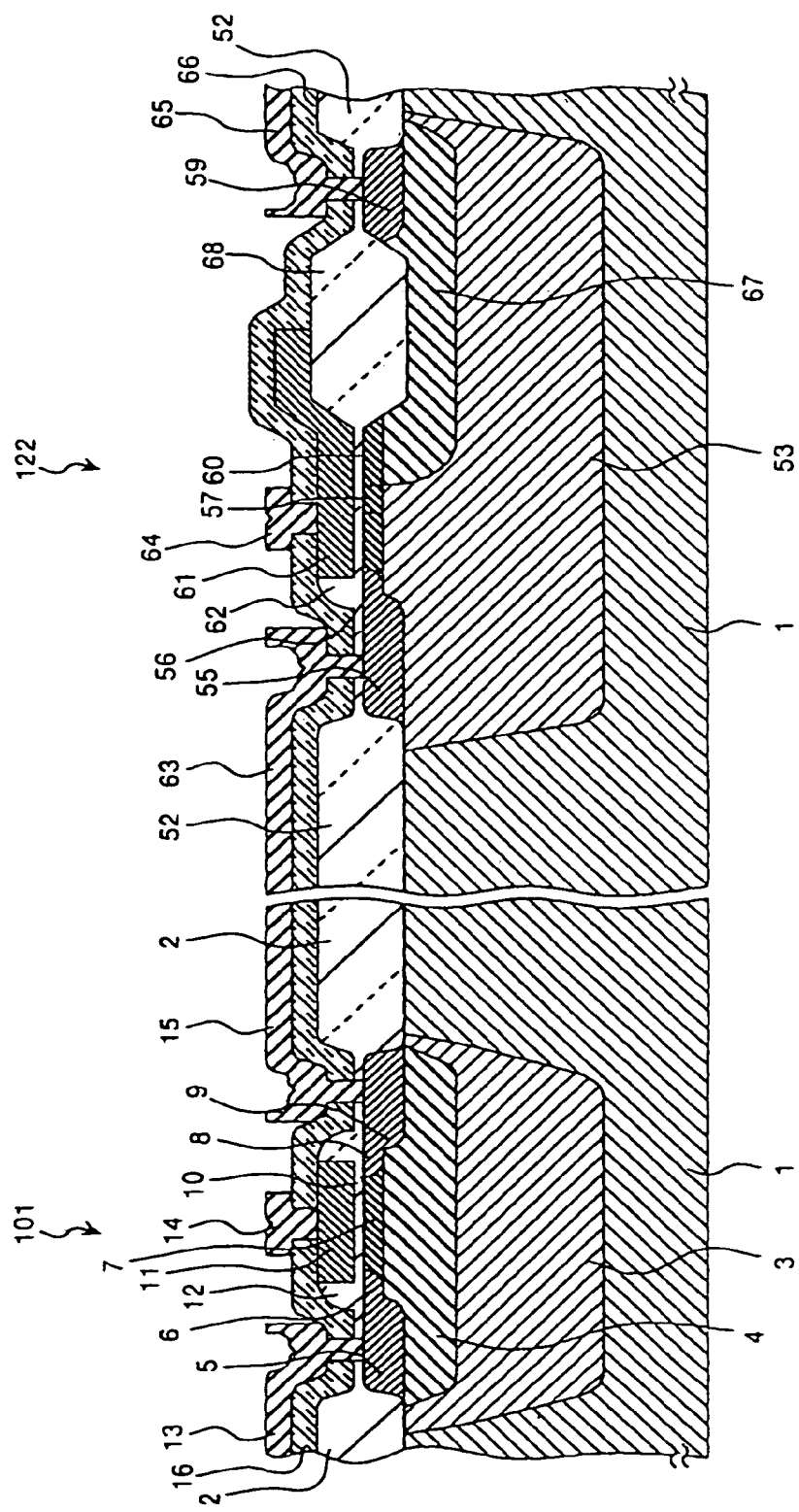
FIG. 7 is a vertical sectional view showing an essential part of a semiconductor integrated circuit device according to a third embodiment.

FIG. 7 is a vertical sectional view showing an essential part of a semiconductor integrated circuit device according to a third embodiment of the present invention. This semiconductor integrated circuit device comprises a digital CMOS transistor constituting a digital circuit and a high voltage-resistance CMOS transistor constituting a high voltage-resistance circuit, both transistors being formed on the same semiconductor substrate 1. However, FIG. 7 shows the digital NMOS transistor 101 (shown in the left of the figure) and a high voltage-resistance NMOS transistor 122 (shown in the right of the figure), with a PMOS transistor omitted therefrom. The same arrangements as those of the first embodiment are denoted by the same reference numerals, and a description thereof is omitted.

The high voltage-resistance NMOS transistor 122 comprises a field oxide film 52 formed on the main surface side of the P-type semiconductor substrate 1 and a P well area 53 formed in an element formed area surrounded by the field oxide film 52 and on the main surface side of the semiconductor substrate 1. An N$^+$ source area 55, a source-side N-LDD area 56, a P$^-$channel formed area 57, and an N$^-$ offset drain area 67 are formed in the P well area 53 and on the main surface side of the semiconductor substrate 1. An N$^+$ drain area 59 isolated from the P$^-$ channel formed area 57 by a selective oxidation (LOCOS) area 68 is formed in the N$^-$ offset drain area 67 and on the main surface side of the semiconductor substrate 1.

Furthermore, gate polysilicon 61 is formed on the P$^-$channel formed area 57 via a gate insulated film 60. A spacer oxide film 62 is formed at the sides of the gate polysilicon 61. A source electrode 63, a gate electrode 64, and a drain electrode 65 are electrically connected to the N$^+$ source area 55, the gate polysilicon 61, and the N$^+$ drain area 59, respectively, via contact holes opened in an interlayer insulated film 66. Furthermore, wires, a passivation film, and the like (not shown) are laminated thereon.

A high voltage-resistance PMOS transistor constituting a high voltage-resistance CMOS transistor together with the high voltage-resistance NMOS transistor 122, constructed as described above, is produced in the N well area (not shown) formed on the main surface side of the semiconductor substrate 1, and is constructed in the same manner as the high voltage-resistance NMOS transistor 122. However, in the above description of the high voltage-resistance NMOS transistor 122, P must be changed to N, while N must be changed to P, except for the description of the semiconductor substrate 1.

A high voltage-resistance CMOS transistor constructed as described above has an impurity concentration and xj depending on a required voltage resistance. For example, for a voltage resistance of 30 to 60V, xj is about 1 μm, and the surface concentration is about $1 \times 10^{17}/cm^3$.

As in the case with The first embodiment, a digital PMOS transistor is produced in the N well area (not shown) formed on the main surface side of the semiconductor substrate 1 and is constructed in the same manner as described for the digital NMOS transistor 101 of the first embodiment, except that P is changed to N.

Figure 8:
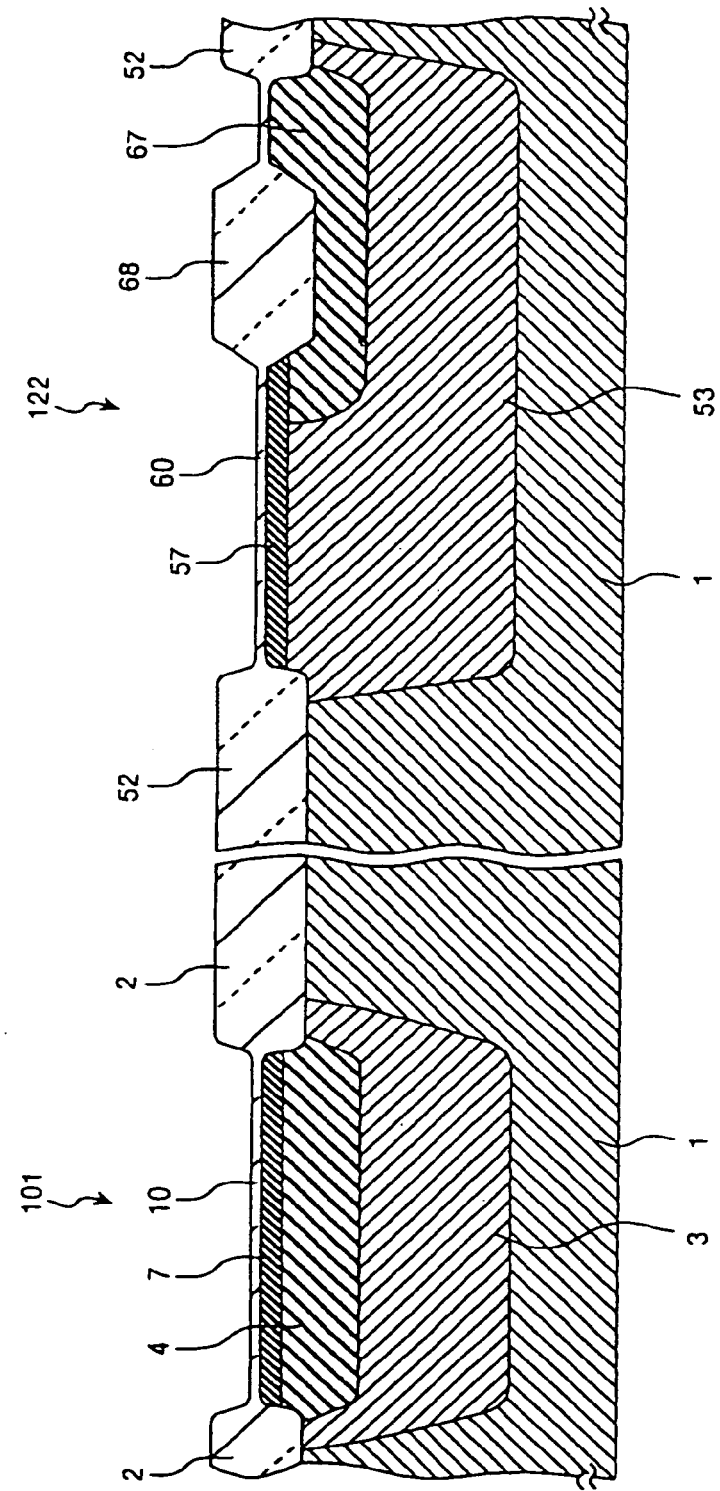
FIG. 8 is a vertical sectional view showing an essential part of the semiconductor integrated circuit device according to a third embodiment at a manufacturing stage.
Figure 9:
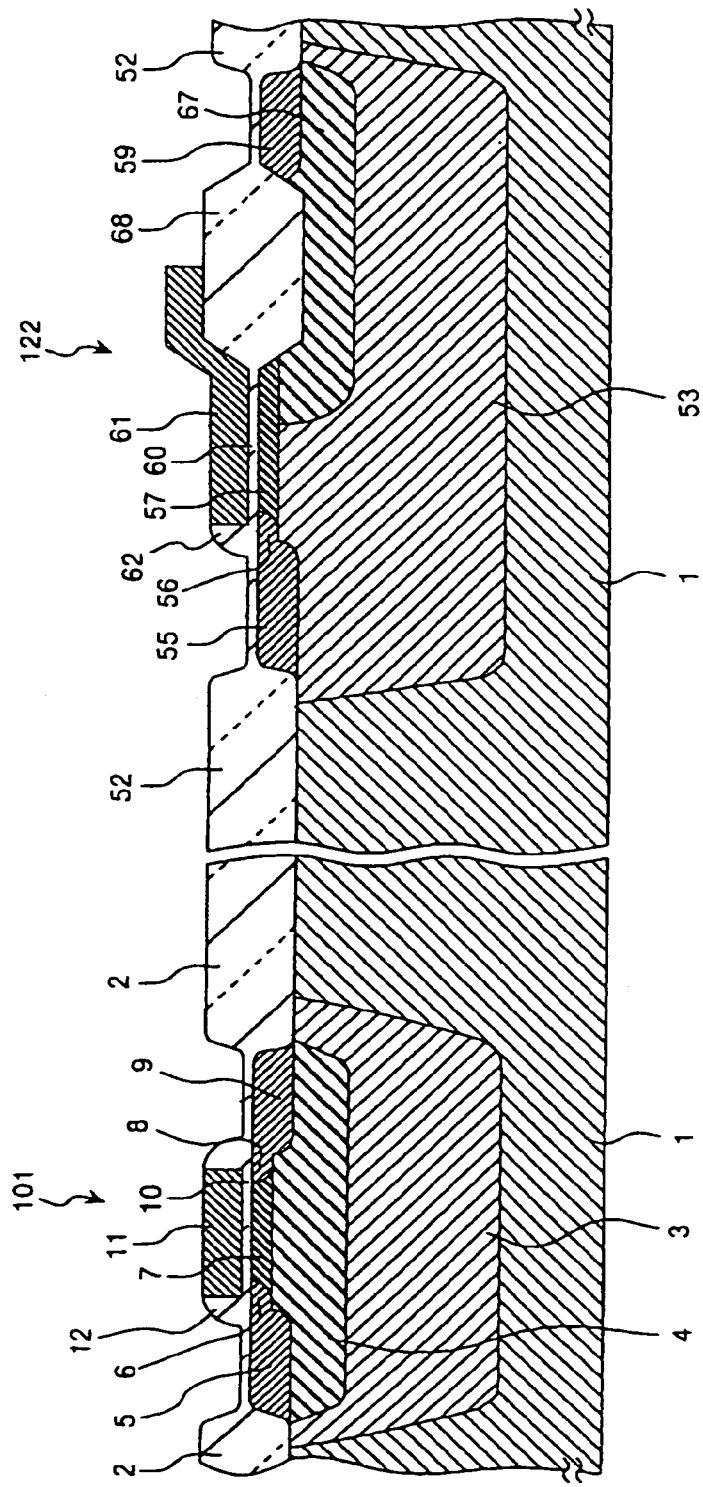
FIG. 9 is a vertical sectional view showing an essential part of the semiconductor integrated circuit device according to a third embodiment at a manufacturing stage.

A process for manufacturing a semiconductor integrated circuit device according to The third embodiment will now be described. FIGS. 8 and 9 are vertical sectional views showing an essential part of a semiconductor integrated circuit device according to the third embodiment at a manufacturing stage. First, as shown in FIG. 8, the P well areas 3 and 53, the N offset drain area 67, the field oxide films 2 and 52, the selective oxidation (LOCOS) area 68, and the gate insulated films 10 and 60 are formed on the main surface side of the semiconductor substrate 1 by a well-known-method.

Subsequently, the area in which the high voltage-resistance NMOS transistor 122 is formed is coated, and the P⁻ punch-through stopper area 4 is formed only in the area in which the digital NMOS transistor 101 is formed, using the ion injection method and a mask (not shown) having a pattern of a window corresponding to the area in which the digital NMOS transistor 101 is formed. Furthermore, the P⁻ channel formed areas 7 and 57 are formed using the ion injection method. This configuration is shown in FIG. 8.

Subsequently, as shown in FIG. 9, the gate polysilicon 11 and 61 is formed, and the N-LDD areas 6, 8, and 56 are formed using the ion injection method and a self-alignment process using the gate polysilicon 11 and 61 as a mask. Then, the spacer oxide films 12 and 62 are formed at the sides of the gate polysilicon 11 and 61, and the N⁺ source areas 5 and 55 and the N+ drain area 9 are formed using the ion injection method and a self-alignment process using the spacer oxide films 12 and 62 as masks.

At this time, ions are injected into the area in which the N⁺ drain area 59 is to be formed, thereby forming the N⁺ drain area 59. Impurity-diffusing areas including the P⁻ punch-through stopper area 4 are activated through a thermal process. This configuration is shown in FIG. 9.

Subsequently, the interlayer insulated film 16 (same as the interlayer insulated film 66) is laminated, and contact holes are opened therein. Then, the source electrodes 13 and 63, the gate electrodes 14 and 64, and the drain electrodes 15 and 65 are formed as shown in FIG. 7. Furthermore, wires, a passivation film, and the like are formed thereon to complete a semiconductor integrated circuit. A PMOS transistor is manufactured in the same manner.

According to the third embodiment, described above, the digital NMOS transistor 101, which comprises the punch-through stopper area 4, and the high voltage-resistance NMOS transistor 122, which has no punch-through stopper area, are formed on the same semiconductor substrate 1, thereby preventing the voltage resistance of the high voltage-resistance NMOS transistor 122 from decreasing. This also applies to digital and high voltage-resistance PMOS transistors.

In the third embodiment, the punch-through stopper area 4 in the digital NMOS transistor 101 may be formed by the self-align process using the gate polysilicon 11 as a mask, so as to have a pocket structure, as in the case with the second embodiment.

Figure 10:
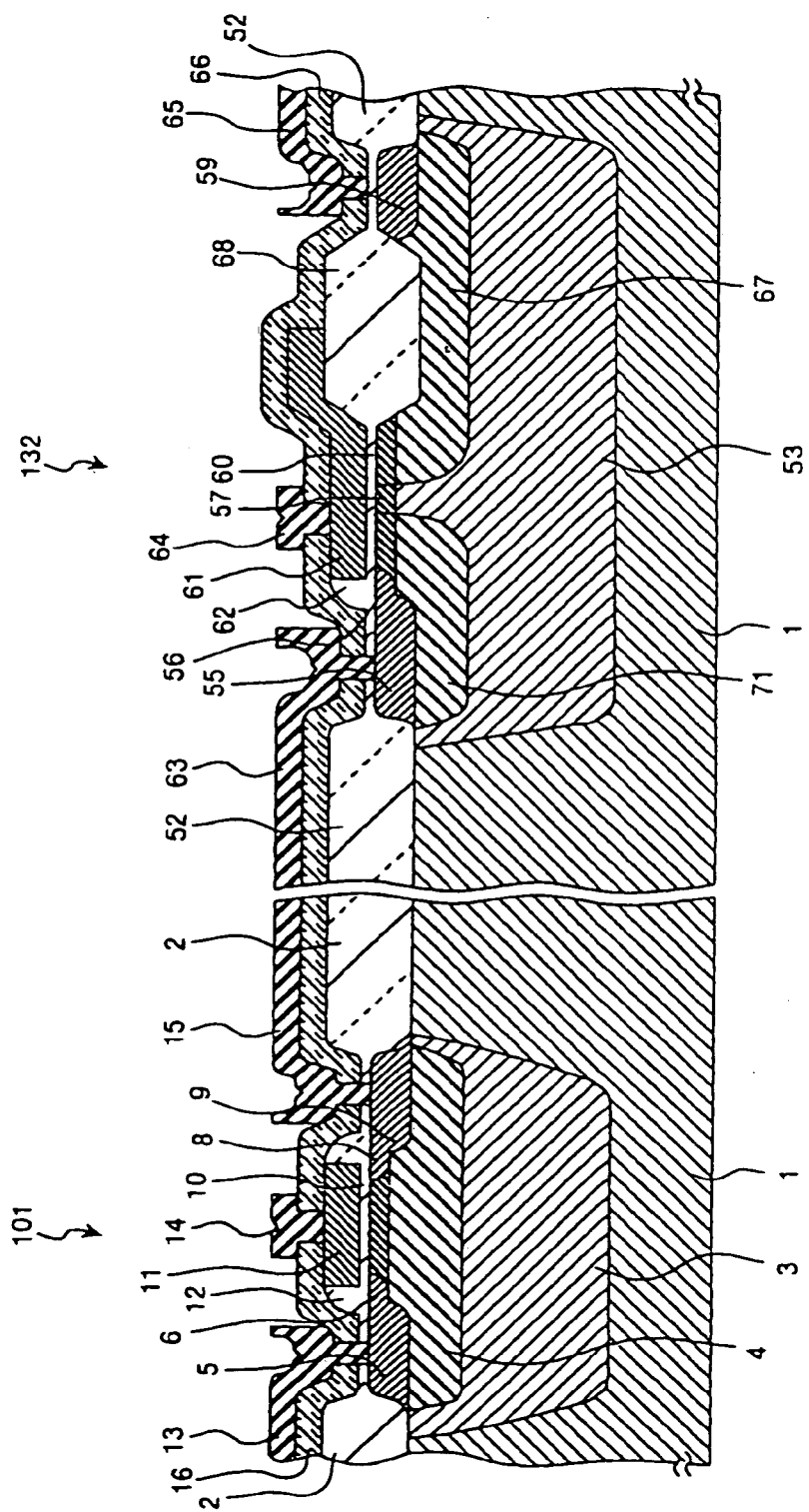
FIG. 10 is a vertical sectional view showing an essential part of a semiconductor integrated circuit device according to a fourth embodiment.

FIG. 10 is a vertical sectional view showing an essential part of a semiconductor integrated circuit device according to a fourth embodiment of the present invention. This semiconductor integrated circuit device comprises a digital CMOS transistor constituting a digital circuit and a high voltage-resistance CMOS transistor constituting a high voltage-resistance circuit, both transistors being formed on the same semiconductor substrate 1.

However, FIG. 10 shows the digital NMOS transistor 101 (shown in the left of the figure) and a high voltage-resistance NMOS transistor 132 (shown in the right of the figure), with a PMOS transistor omitted therefrom. The same arrangements as those of the first embodiment are denoted by the same reference numerals, and a description thereof is omitted.

The high voltage-resistance NMOS transistor 132 is constructed so that a P⁻ punch-through stopper area 71 is added to a source section of the high voltage-resistance NMOS transistor 122 of the semiconductor integrated device according to the third embodiment. Accordingly, the same arrangements as those of The third embodiment are denoted by the same reference numerals, and a description thereof is omitted. The P⁻ punch-through stopper area 71 is formed in the P well area 53 and on the main surface side of the semiconductor substrate 1 so as to surround the N⁺ source area 55 and the source-side N-LDD area 56.

A high voltage-resistance PMOS transistor constituting a high voltage-resistance CMOS transistor together with the high voltage-resistance NMOS transistor 132, constructed as described above, is produced in the N well area (not shown) formed on the main surface side of the semiconductor substrate 1 and is constructed in the same manner as the high voltage-resistance NMOS transistor 132. However, in the above description of the high voltage-resistance NMOS transistor 132, P must be changed to N, while N must be changed to P, except for the description of the semiconductor substrate 1.

A high voltage-resistance CMOS transistor constructed as described above has an impurity concentration and xj depending on a required voltage resistance. For example, for a voltage resistance of 30 to 60V, xj is about 1 μm, and the surface concentration is about $1 \times 10^{17}/cm^3$.

As in the case with The first embodiment, a digital PMOS transistor is produced in the N well area (not shown) formed on the main surface side of the semiconductor substrate 1 and is constructed in the same manner as described for the digital NMOS transistor 101, except that P is changed to N.

Figure 11:
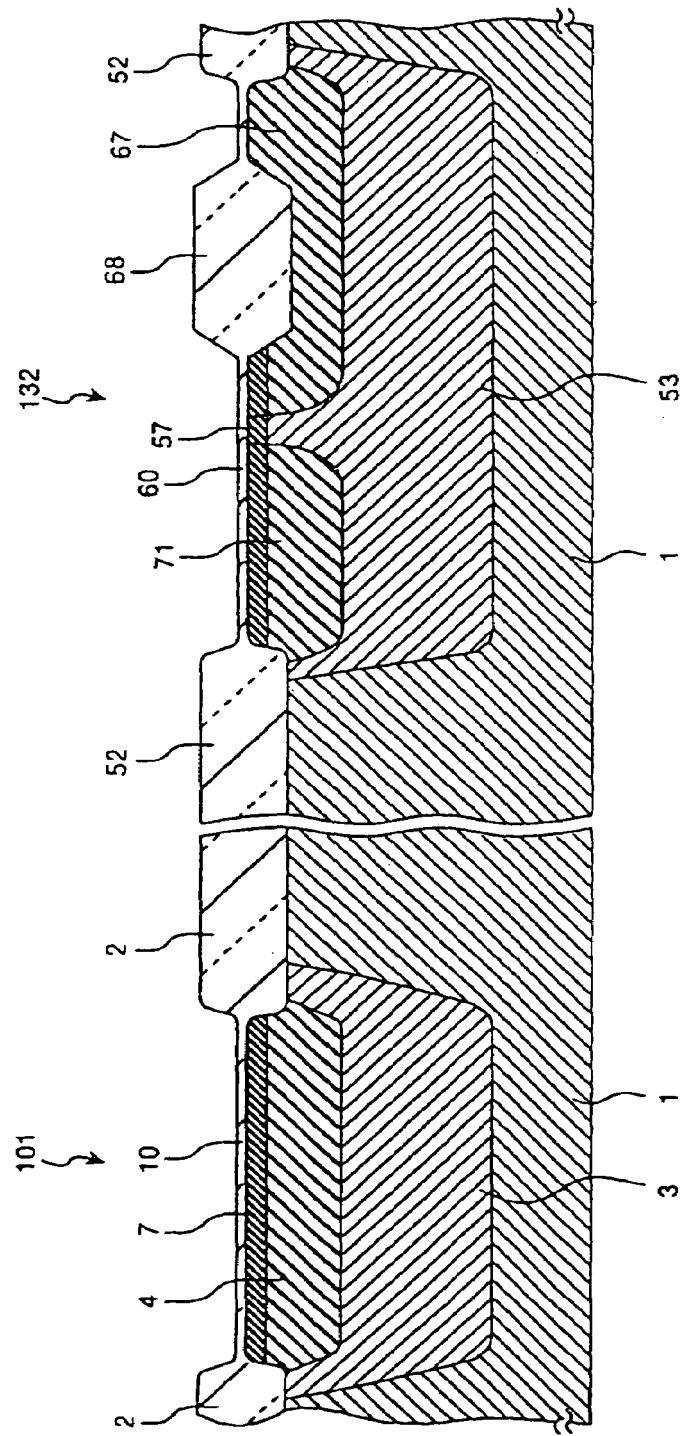
FIG. 11 is a vertical sectional view showing an essential part of the semiconductor integrated circuit device according to the fourth embodiment at a manufacturing stage.
Figure 12:
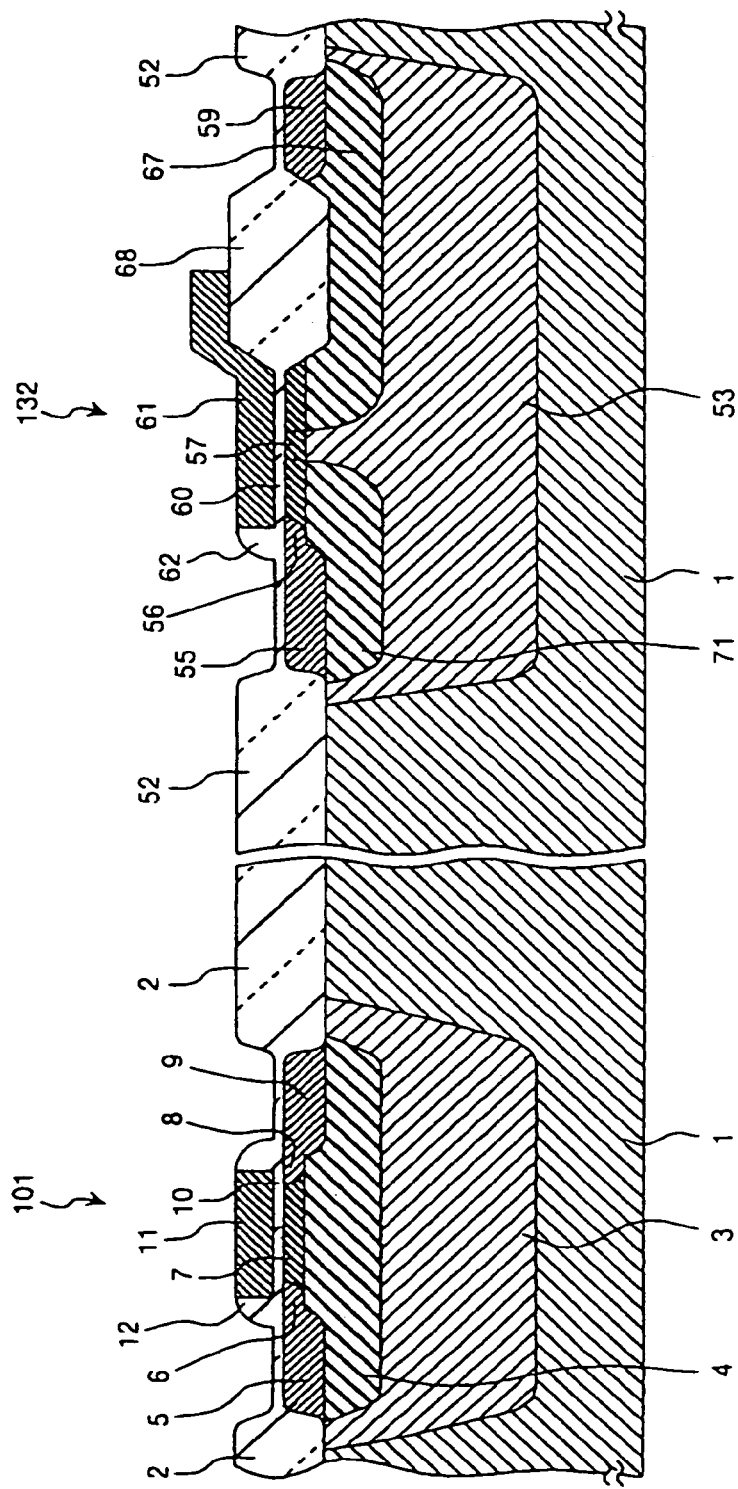
FIG. 12 is a vertical sectional view showing an essential part of the semiconductor integrated circuit device according to the fourth embodiment at a manufacturing stage.

A process for manufacturing a semiconductor integrated circuit device according to The fourth embodiment will now be described. FIGS. 11 and 12 are vertical sectional views showing an essential part of a semiconductor integrated circuit device according to the fourth embodiment at a manufacturing stage. First, as shown in FIG. 11, the P well areas 3 and 53, the N⁻ offset drain area 67, the field oxide films 2 and 52, the selective oxidation (LOCOS) area 68, and the gate insulated films 10 and 60 are formed on the main surface side of the semiconductor substrate 1 by a well-known method.

Subsequently, the area in which a drain of the high voltage-resistance NMOS transistor 132 is formed is coated, and a P⁻ punch-through stopper area 71 is formed in the area in which a source of the high voltage-resistance NMOS transistor 132 is formed, using the ion injection method and a mask (not shown) having a pattern of windows corresponding to the areas in which the source of the high voltage-resistance NMOS transistor 132 and the digital NMOS transistor 101 are formed. Furthermore, the P⁻ punch-through stopper area 4 is formed in the area in which the source of the digital NMOS transistor 101 is formed. Furthermore, the P⁻ channel formed areas 7 and 57 are formed using the ion injection method. This configuration is shown in FIG. 11.

Subsequently, as shown in FIG. 12, the gate polysilicon 11 and 61 is formed, and the N-LDD areas 6, 8, and 56 are formed using the ion injection method and a self-alignment process using the gate polysilicon 11 and 61 as a mask. Then, the spacer oxide films 12 and 62 are formed at the sides of the gate polysilicon 11 and 61, and the N⁺ source areas 5 and 55 and the N+ drain area 9 are formed using the ion injection method and a self-alignment process using the spacer oxide films 12 and 62 as masks.

At this time, ions are injected into the area in which the N⁺ drain area 59 is to be formed, thereby forming the N⁺ drain area 59. Impurity-diffusing areas including the P⁻ punch-through stopper area 4 and 71 are activated through a thermal process. This configuration is shown in FIG. 12.

Subsequently, the interlayer insulated film 16 (same as the interlayer insulated film 66) is laminated, and contact holes are opened therein. Then, the source electrodes 13 and 63, the gate electrodes 14 and 64, and the drain electrodes 15 and 65 are formed as shown in FIG. 10. Furthermore, wires, a passivation film, and the like are formed thereon to complete a semiconductor integrated circuit. A PMOS transistor is manufactured in the same manner.

According to the fourth embodiment, described above, the digital NMOS transistor 101, which comprises the punch-through stopper area 4, and the high voltage-resistance NMOS transistor 132, which has no punch-through stopper area in a drain section thereof and has the punch-through stopper area 71 in a source section thereof, are formed on the same semiconductor substrate 1. Consequently, the voltage resistance of the high voltage-resistance NMOS transistor 132 is prevented from decreasing, and the channel length of the high voltage-resistance NMOS transistor 132 is reduced; that is, the size of the device can be reduced. This also applies to digital and high voltage-resistance PMOS transistors.

In the fourth embodiment, the punch-through stopper area 4 in the digital NMOS transistor 101 may be formed by the self-alignment process using the gate polysilicon 11 as a mask, so as to have a pocket structure, as in the case with the second embodiment.

Figure 13:
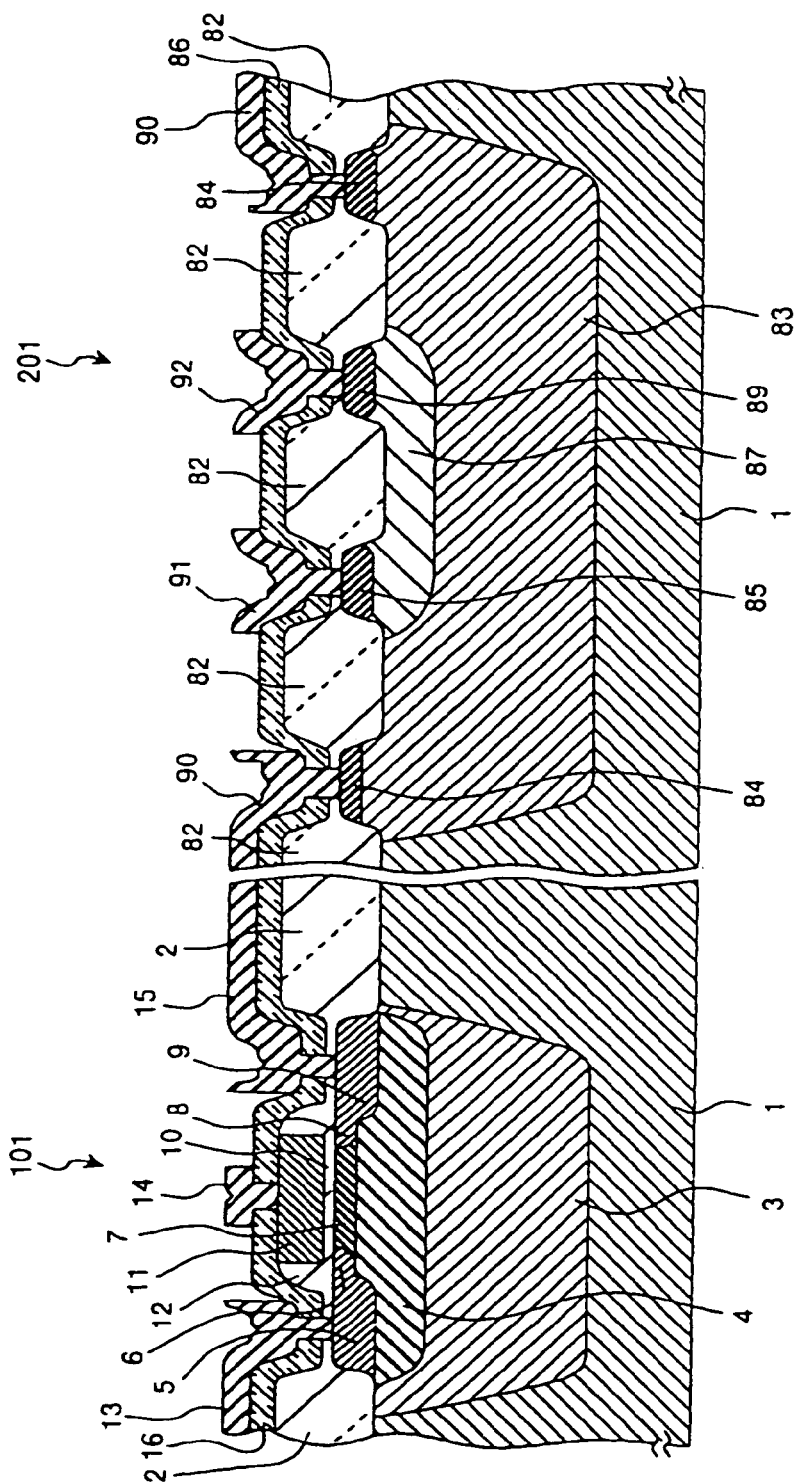
FIG. 13 is a vertical sectional view showing an essential part of that portion of the semiconductor integrated circuit device according to the present invention in which a bipolar transistor is integrated with the device.

In the above description, the present invention is not limited to the case in which a digital CMOS transistor and an analog or high voltage-resistance CMOS transistor are integrated on the same substrate, but is also applicable to the case in which a digital CMOS transistor, an analog CMOS transistor, and a bipolar transistor are integrated on the same substrate. In this case, for example, as shown in FIG. 13, a well area 83 may be formed into a collector area of a bipolar transistor 201, a semiconductor area 87 in the well area 83 which has a conductivity type opposite that of the well area 83 may be formed into a base area of the bipolar transistor 201, and a semiconductor area 89 in the base-area-constituting semiconductor area 87 which corresponds to a source drain area may be formed into an emitter area of the bipolar transistor 201. For example, in an npn transistor, the well area 83 has an N type, the semiconductor area 87, constituting the base area, has a P type, and the semiconductor area 89, constituting the emitter area, has an N type. A punch-through stopper area is formed only in the digital CMOS transistor. The semiconductor area 87, constituting the base area, is formed simultaneously with, for example, the formation of the offset drain 67 in The third embodiment. In FIG. 13, reference numeral 82 denotes a selective oxidation area, 84 and 85 are concentrated impurity areas for contacts, 86 is an interlayer insulated film, 90 is a collector electrode, 91 is a base electrode, and 92 is an emitter electrode.

Furthermore, the present invention is applicable to the integration of a digital CMOS transistor, an analog CMOS transistor, and a diode. In this case, for example, in the configuration shown in FIG. 13, the diode may be constructed using the PN junction between the well area 83 and the semiconductor area 87, constituting the base area, or the PN junction between the semiconductor area 87, constituting the base area, and the semiconductor area 89, constituting the emitter area. Then, a punch-through stopper area may be formed only in the digital CMOS transistor.

Figure 14:
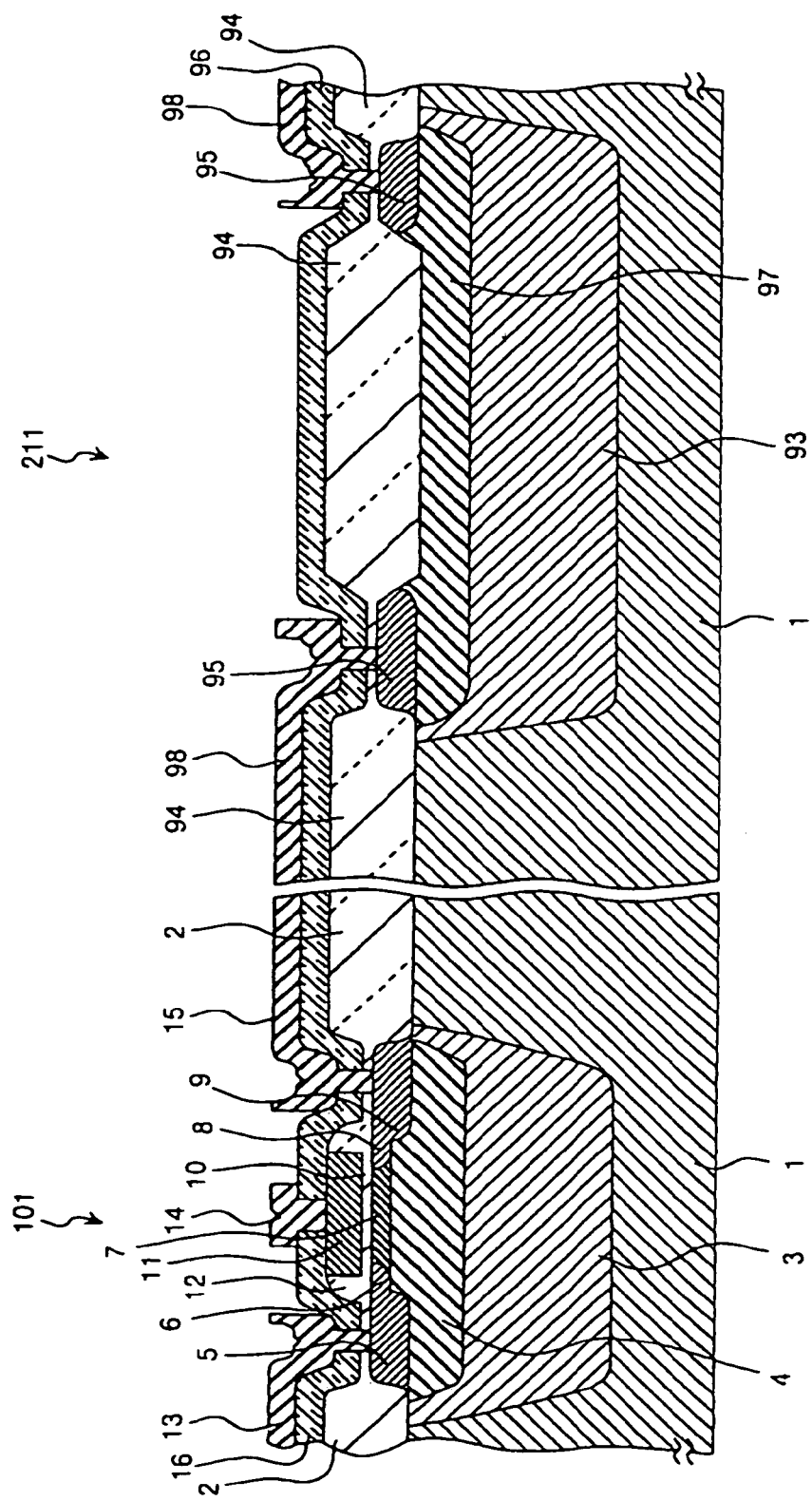
FIG. 14 is a vertical sectional view showing an essential part of that portion of the semiconductor integrated circuit device according to the present invention in which a diffusion resistor is integrated with the device.

Furthermore, the present invention is applicable to the integration of a digital CMOS transistor, an analog CMOS transistor, and a diffusion resistor. In this case, for example, as shown in FIG. 14, an impurity diffusion area 97 formed on a well area 93 may be used to construct a diffusion resistor 211, and a punch-through stopper area may be formed only in the digital CMOS transistor. The impurity diffusion area 97 is formed simultaneously with, for example, the formation of the offset drain 67 in the third embodiment. Here, the diffusion resistor 211 has, for example, an xj of about 0.5 to 2.5 µm and a surface impurity concentration of about $1 \times 10^{16}$ to $5 \times 10^{18}/cm^3$. In FIG. 14, reference numeral 94 denotes a selective oxidation area, 95 is a concentrated impurity area for contacts, 86 is an interlayer insulated film, and 98 is an electrode.

According to the present invention, a submicron CMOS transistor comprising a punch-through stopper area and an analog CMOS transistor, a high voltage-resistance MOS transistor, a bipolar transistor, a diode, or a diffusion resistor having no punch-through stopper area are formed on the same semiconductor substrate. The present invention therefore provides a semiconductor integrated circuit device having a submicron CMOS transistor mixed with an analog CMOS transistor, a high voltage-resistance MOS transistor, a bipolar transistor, a diode, or a diffusion resistor without degrading the characteristics of these components.

What is claimed is:

1. A method of manufacturing a semiconductor integrated circuit device, comprising the steps of:

providing a semiconductor substrate;

forming a first well and a second well both of a first conductivity type in the semiconductor substrate, the first and second wells being discrete and spaced apart from each other;

forming a punch-through stopper area in said first well; and forming a source area and a drain area in each of the first and second wells, wherein the first well has the source and drain areas formed over the punch-through stopper area to form a first lateral MOS transistor, the punch-through stopper area offering a punch-through voltage resistance between the source area and the drain area thereof, and wherein the second well has the respective source and drain areas forming a semiconductor element that does not require a punch-through stopper area in part or all of the area thereof, wherein the semiconductor element is a second lateral MOS transistor having a lower threshold voltage than the first lateral MOS transistor, and wherein the first and second lateral MOS transistors each include a channel area formed between the respective source and drain region areas, and the length of the channel area of the first lateral MOS transistor is smaller than the length of the channel area of the second lateral MOS transistor.

2. A method according to claim 1, wherein the punch through stopper area is formed using ion injection while masking the semiconductor element.

3. A method according to claim 2, further including the step of forming a gate polysilicon layer, wherein the punch-through stopper area is formed using the gate polysilicon as a mask.

4. A method according to claim 3, further including the step of forming a gate electrode with the polysilicon layer.

* * * * *